Jan. 10, 1961 W. S. BACHMAN 2,968,006
A.C.-D.C. AMPLIFIER
Filed Oct. 23, 1956
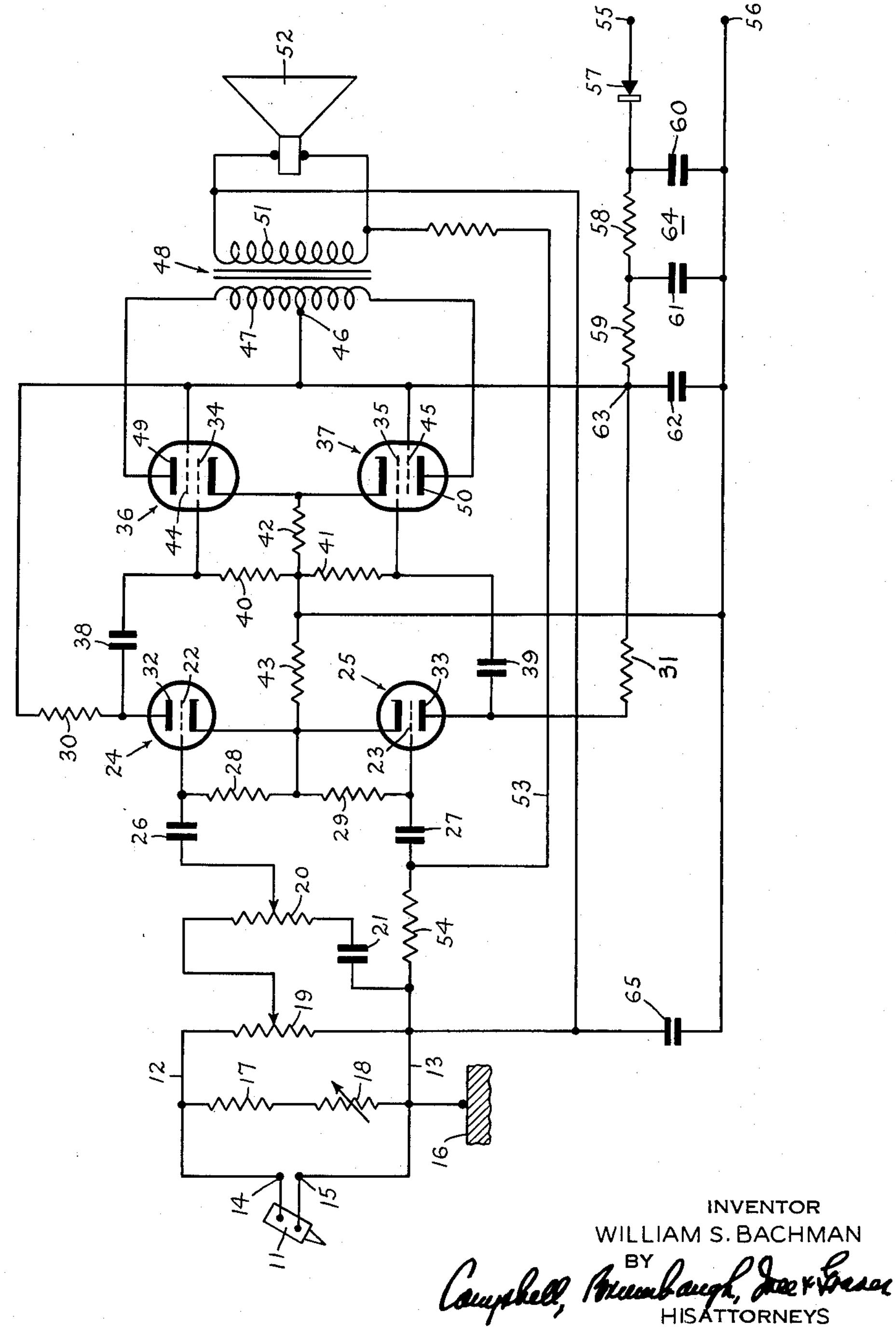
INVENTOR
WILLIAM S. BACHMAN
BY
Campbell, Brumbaugh, Free & Graves
HIS ATTORNEYS United States Patent Office 2,968,006

Patented Jan. 10, 1961

2,968,006

A.C.-D.C. AMPLIFIER

William S. Bachman, Southport, Conn., assignor to Columbia Broadcasting System, Inc., New York, N.Y., a corporation of New York Filed Oct. 23, 1956, Ser. No. 617,773

4 Claims. (Cl. 330—123)

This invention relates to transformerless or A.C.-D.C. type amplifiers and more particularly to a new and improved A.C.-D.C. amplifier embodying means capable of eliminating the objectionable hum which is introduced when such amplifiers are connected to an external signal source.

In electrical equipment such as phonographs, where it is desired to provide for operation from either an A.C. or a D.C. power source, it is customary to use a transformerless-type amplifier having a rectifier-filter network capable of rectifying an A.C. voltage and passing a D.C. voltage, so that the proper D.C. voltages are supplied to the amplifier circuit regardless of whether the power source to which it is connected is A.C. or D.C.

For optimum signal reproduction with such amplifiers, the B negative conductor of the amplifier circuit should desirably be directly connected to or closely associated with the input signal source. With conventional A.C.-D.C. amplifiers, however, in which the negative power supply conductor is directly connected to the B negative conductor, it is necessary to include, between the B negative conductor and the amplifier input circuit, a series impedance large enough to prevent objectionable shock current. As a result, an undesired ground current signal is induced in the signal input circuit when the amplifier is connected to an external signal source such as a tuner, thereby causing an objectionable hum in the amplifier output.

Accordingly, it is an object of this invention to provide a new and improved A.C.-D.C. amplifier system which may be connected to an external signal source, such as a tuner, without causing objectionable hum.

Another object of the invention is to provide a new and improved A.C.-D.C. amplifier system in which control rheostats, the input signal source and the feedback source may be directly connected to the chassis.

According to the invention, an input signal to be amplified is applied between the two control grids of a balanced cathode-coupled phase inverter network. The connections are such that any ground current signal appearing in the signal input circuit is imposed on both grids of the phase inverter in phase, resulting in no output signal from the amplifier. The desired information signal, however, is applied to both grids in out-of-phase relation and, therefore, results in useful output which can be reproduced as sound without objectionable hum.

For a better understanding of the invention, reference is made to the following description of a typical embodiment, taken with reference to the accompanying drawing showing a schematic circuit diagram of an A.C.-D.C. amplifier constructed according to the invention.

Referring to the single figure in detail, a phonograph pickup 11 or other signal source is directly connected to the amplifier input terminals 14 and 15, respectively. The terminal 15 is directly connected to the chassis 16 of the phonograph, contrary to the usual practice. Various signal modifiers such as a bass control resistor 17 and rheostat 18, a volume control potentiometer 19 and a treble control potentiometer 20 with an associated condenser 21 may be interposed between the two conductors 12 and 13, if desired.

The input signal is applied to the control grids 22 and 23 of two amplifier tubes 24 and 25 through two condensers 26 and 27, respectively. The two tubes 24 and 25, which may be contained in a single envelope such as the 12AX7 type, for example, comprise a phase inverter and are electrically balanced by providing two identical grid bias resistors 28 and 29 and two identical plate load resistors 30 and 31, respectively, their cathodes being connected together and through a large cathode resistor 43 to the negative side of the power supply.

The plates 32 and 33 of the tubes 22 and 23 are connected to the control grids 34 and 35, respectively, of a second pair of amplifier tubes 36 and 37, respectively, through two condensers 38 and 39, respectively. The amplifier tubes 36 and 37, which may be of the 50L6 type, for example, are connected in push-pull arrangement, having identical grid leak resistors 40 and 41 which are connected to the cathodes of these tubes through a resistor 42 and to the negative side of the power supply.

The plate load resistor 31 is connected to the B+ lead of the power supply at the point 63. Similarly, the plate load resistor 30, the screen grids 44 and 45 of the two tubes 36 and 37, respectively, and a common center tap 46 of the primary winding 47 of an output transformer 48 are also connected to the B+ lead at 63, the plates 49 and 50 of the amplifiers 36 and 37 being connected to the ends of the primary winding 47, respectively. The secondary winding 51 of the output transformer 48 is connected to a loudspeaker 52 or other signal detecting device.

Plate voltage for the amplifier is provided by a conventional A.C.-D.C. power supply comprising a rectifier-filter network 64. The network 64 includes a unidirectionally conductive device 57 such as a selenium rectifier and two series resistors 58 and 59 through which B+ voltage is supplied to the point 63 and thence the two plate load resistors 30 and 31. Three shunt condensers 60, 61 and 62 complete the filter network. The negative conductor is directly connected to the junction of the resistors 40, 41, 42 and 43, and to the chassis 16 of the phonograph through an isolating condenser 65 which is of sufficiently high impedance to prevent objectionable shock current to the user of the equipment.

An important advantage of the amplifier of the invention is that it permits the introduction of negative feedback between the chassis and the input grid 23 of the tube. Thus, inverse feedback may be introduced by inserting a resistor 54 between the conductor 13 and the condenser 27 and connecting the junction between the resistor 54 and the condenser 27 by a conductor 53 to one side of the secondary transformer coil 51. The other side of the secondary coil is connected to the chassis 16. This avoids the necessity of a tertiary winding on the output transformer 48 which has been necessary heretofore.

In operation, an information signal applied at the terminals 14 and 15 is impressed between the grids 22 and 23 of the phase inverter tubes 24 and 25. This produces identical signals of opposite phase at the plates 32 and 33. These signals, after amplification by the tubes 36 and 37, are applied to the opposite ends of the primary winding 47 of the output transformer 48 and, being out of phase, induce a signal in the output winding 51 which is reproduced as sound by the loudspeaker 52.

On the other hand, any undesired ground current signals which may be induced in the input signal circuit cause identical in-phase signals to be applied to the grids

22 and 23. Because of the balanced push-pull arrangement of the phase inverter tubes 24 and 25 and the amplifiers 36 and 37, both of these signals receive equal amplification. Thus, identical signals which are in phase are applied to the opposite ends of the primary winding 47 of the output transformer 48. Hence, no ground current signal is induced in the transformer secondary winding 51, thereby eliminating from the output signal the objectionable hum which results from ground current in other A.C.-D.C. amplifier circuits of the prior art.

The possibility of inducing ground current signals in the input signal circuit is further reduced by the elimination of the customary isolating impedances between the input signal circuit and the chassis 16. Objectionable shock current is effectively prevented by the isolation condenser 65 interposed between the power supply circuit and the chassis.

If the amplifier is connected to an external source which has a capacitor between one side of the power line and its chassis, it may be necessary to reverse its power plug so that the same side of the line is by-passed to the chassis as in the amplifier. Also, in the event both sides of the line are by-passed to the chassis of the external source, one of the condensers used for this purpose should be connected across the line so as to minimize hum.

The embodiment of the invention described above is intended to be illustrative rather than restrictive of the invention and it is susceptible of modification and change within the scope of the following claims.

I claim:

1. An A.C.-D.C. amplifier mounted on a conductive chassis comprising a signal input channel including a pair of receiving terminals and a conductor connected to said chassis, a balanced, cathode-coupled electron tube phase inverter having a pair of input terminals connected to receive the output of said channel and to provide a further output each of the phase inverter input terminals being linked to one of the signal receiving terminals and both of the phase inverter input terminals being linked to the conductor connected to the chassis so as to cause an input signal at the receiving terminals to be applied in out-of-phase relation at the phase inverter terminals, power supply means including a positive conductor and a negative conductor connected directly to an electrical energy input terminal of said amplifier and arranged to operate from either an alternating current source or a direct current source; circuit means connecting said power supply means to said phase inverter for energizing the latter including a connection between the negative conductor and the coupled cathodes of the phase inverter, and a shock hazard minimizing impedance connected between said negative conductor and said chassis, thereby impressing any signals induced across the shock hazard minimizing impedance upon the pair of phase inverter terminals in in-phase relation so that they are cancelled by the phase inverter.

2. An amplifier as defined in claim 1 wherein the linkage to one of the input terminals includes signal modifying means having a terminal connected to said conductor connected to the chassis.

3. An amplifier as defined in claim 1 together with feedback means interposed between said conductor connected to the chassis and one input terminal of said phase inverter and including a portion of said amplifier beyond said phase inverter.

4. An A.C.-D.C. amplifier mounted on a conductive chassis comprising a signal input channel including a pair of receiving terminals and a conductor connected to said chassis, a balanced, cathode-coupled phase inverter including a pair of electron tubes having control grid electrodes each linked to one of the receiving terminals and both linked to said conductor whereby signals attributable to ground currents appearing at said conductor are impressed on said control grid electrodes in phase, whereas input signals of external origin supplied to said channel are impressed on said control grid electrodes out of phase, power supply means including positive and negative conductors connected directly to the electrical energy input terminals of said amplifier and arranged to operate from either an alternating current source or a direct current source, circuit means connecting said phase inverter to said positive and negative conductors for energization therefrom including a connection between the negative conductor and the coupled cathodes of the phase inverter, a shock hazard minimizing impedance connected between said negative conductor and said chassis, thereby impressing any signals induced across the shock hazard minimizing impedance upon the pair of phase inverter control grid electrodes in in-phase relation so that they are cancelled by the phase inverter and push-pull connected electron tube amplifier means connected to receive the output of said phase inverter.

References Cited in the file of this patent

UNITED STATES PATENTS

| | | |
|---|---|---|
| 2,281,488 | Freeland | Apr. 28, 1942 |
| 2,529,459 | Pourciau | Nov. 7, 1950 |
| 2,594,841 | Arndt | Apr. 29, 1952 |
| 2,695,337 | Burwen | Nov. 23, 1954 |
| 2,716,162 | Pearlman | Aug. 23, 1955 |
| 2,792,458 | Good | May 14, 1957 |

OTHER REFERENCES

Article I, RCA Receiving Tube Manual, copyright 1940, page 211, Figure 14–12 relied upon.

Article II, RCA Receiving Tube Manual, copyright 1954, page 273, Figure 17–4 relied upon.

Article I, Garner, Transistor Guitar Amplifier, "Radio Television News," November 1953, pages 74 and 75 relied upon.

Caldwell-Clement's, TV Electronic Technician, section 6 of February 1953. Schematic of Columbia Records 360 Phono Amplifier-Circuit Digest No. 43. Page 1 relied upon.